United States Patent

Ishikawa et al.

[11] Patent Number: 5,989,942
[45] Date of Patent: Nov. 23, 1999

[54] METHOD FOR FABRICATING SEMICONDUCTOR DEVICE

[75] Inventors: Takae Ishikawa; Katsutoshi Mine; Hiroyosi Naito; Kimio Yamakawa, all of Chiba Prefecture, Japan

[73] Assignee: Dow Corning Toray Silicone Co., Ltd., Tokyo, Japan

[21] Appl. No.: 09/237,610

[22] Filed: Jan. 25, 1999

Related U.S. Application Data

[62] Division of application No. 08/561,472, Nov. 21, 1995, Pat. No. 5,907,190.

[30] Foreign Application Priority Data

Nov. 24, 1994 [JP] Japan .................................. 6-314185
Dec. 29, 1994 [JP] Japan .................................. 6-339035

[51] Int. Cl.⁶ .................................................. H01L 21/44
[52] U.S. Cl. ......................... 438/127; 438/124; 438/126
[58] Field of Search ................................ 438/124, 125, 438/126, 127

[56] References Cited

U.S. PATENT DOCUMENTS

| | | | |
|---|---|---|---|
| 4,769,344 | 9/1988 | Sakai et al. | 439/124 |
| 5,243,756 | 9/1993 | Hamburgen et al. | 438/124 |
| 5,348,913 | 9/1994 | McBride et al. | 438/126 |
| 5,391,924 | 2/1995 | Uchida et al. | 257/789 |
| 5,436,203 | 7/1995 | Lin | 438/126 |
| 5,571,851 | 11/1996 | Freeman et al. | 424/445 |
| 5,641,997 | 6/1997 | Ohta et al. | 257/788 |
| 5,683,806 | 11/1997 | Sakumoto et al. | 525/126 |

FOREIGN PATENT DOCUMENTS

| | | |
|---|---|---|
| 5009270 | 5/1973 | Japan . |
| 61-51834 | 3/1986 | Japan . |
| 1191056 | 8/1986 | Japan . |
| 2092344 | 4/1987 | Japan . |
| 11310 | 1/1988 | Japan . |
| 2311520 | 12/1990 | Japan . |
| 5206325 | 1/1993 | Japan . |
| 283561 | 10/1993 | Japan . |
| 1549242 | 7/1979 | United Kingdom . |

*Primary Examiner*—Kevin M. Picardat
*Attorney, Agent, or Firm*—Larry A. Milco

[57] ABSTRACT

A method for fabricating a semiconductor device, comprising the steps of coating the surface of a semiconductor element with a curable silicone composition comprising a curable silicone polymer and a filler having an average particle diameter of 0.01 to 500 micrometers and a specific gravity of 0.01 to 0.95, wherein the filler is selected from the group consisting of powders of organic resins, hollow forms of organic resin powders, hollow inorganic powders, intrinsically electrically conductive fillers, and fillers having a surface that is electrically conductive; allowing sufficient time to elapse for the filler in the part of the curable silicone composition adjoining the element to migrate into the part of the curable silicone composition remote from the element; and curing the curable silicone composition.

6 Claims, 3 Drawing Sheets

METHOD FOR FABRICATING SEMICONDUCTOR DEVICE

This application is a division of Ser. No. 08/561,472 filed Nov. 21, 1995, now U.S. Pat. No. 5,907,190.

FIELD OF THE INVENTION

This invention relates to semiconductor devices and methods for their fabrication. More particularly, this invention relates to semiconductor devices having cured silicone covering the surface of the semiconductor elements. These coatings can be designed to resist swelling when cleaned by solvents such that the semiconductor elements and bonding wires of these devices are neither ruptured nor deformed by such cleaning. The coatings can also be designed to resist failure and faulty operation due to static electricity. This invention also relates to a method for fabricating these semiconductor devices.

BACKGROUND OF THE INVENTION

The surface of semiconductor elements are typically coated with cured silicone to protect them from moisture and external stresses. This is true for both face-up semiconductor devices, in which the semiconductor element and lead frame are electrically connected through bonding wires, and for face-down semiconductor devices, in which the semiconductor element is electrically connected to the lead frame through solder bumps.

It has been found that using a solvent to clean the solder flux off these devices can cause problems. For instance, solvent cleaning can cause swelling of the silicone coating which results in warpage or destruction of the semiconductor element, deformation or breakage of the bonding wires and delamination of the solder bumps.

It has also been found that when such devices are used in a static-prone location, static electricity will gradually accumulate on the cured silicone covering the surface of the semiconductor element and either fail or operate erratically. This can occur, for instance, in applications such as image sensors used in facsimile equipment for reading the document to be transmitted or the thermal print heads used in printers for printing on the output paper.

To solve the solvent cleaning problem, the art suggests using (a) semiconductor devices in which the surface of the semiconductor element is coated with cured silicone and the element is then additionally sealed in a ceramic or plastic package and (b) semiconductor devices in which the surface of the element is covered with cured silicone containing a high loading of dispersed filler. The former solution results in increased costs and a reduced efficiency in mass production. The latter solution is disadvantageous in that heat cycling causes problems such as damage to the surface of the semiconductor element by the filler and deformation or rupture of the semiconductor element or bonding wires.

Similarly, to solve the static electricity problem, the art suggests using semiconductor devices in which the surface of the semiconductor element is coated with cured silicone and the element is then additionally coated with metal or plastic. Again, this solution results in increased costs and a reduced efficiency in mass production.

The present invention takes as its object the introduction of a semiconductor device whose semiconductor element is coated with a cured silicone which resists swelling when cleaned with a solvent. The semiconductor element and bonding wires are, therefore, neither ruptured nor deformed by solvent cleaning. An additional object of the present invention is the introduction of a semiconductor device whose semiconductor element is resistant to the failure and faulty operation which can be caused by static electricity. A final object of the present invention is the introduction of a method for fabricating semiconductor devices having these types of reliability.

SUMMARY OF THE INVENTION

The present invention relates to a semiconductor device. The device comprises a semiconductor substrate having a semiconductor element mounted thereon. A coating comprising a cured silicone in which there is dispersed a filler having an average particle diameter of 0.01 to 500 micrometers and a specific gravity of 0.01 to 0.95 covers the semiconductor element. The concentration of filler in the cured silicone is higher in the part of the coating remote from the element than in the part of the coating adjoining the element.

The invention also relates to a method for fabricating a semiconductor device. The method comprises coating the surface of a semiconductor element with a curable silicone composition comprising a curable silicone polymer and a filler having an average particle diameter of 0.01 to 500 micrometers and a specific gravity of 0.01 to 0.95. A sufficient time is then allowed to elapse for the filler in the part of the curable silicone composition adjoining the element to migrate into the part of the curable silicone composition remote from the element. The curable silicone composition is then cured.

DETAILED DESCRIPTION OF THE INVENTION

The present invention is based on the unexpected discovery that the silicone coatings of the present invention on semiconductor devices mounted on circuit substrates can be designed to inhibit swelling when cleaned with a solvent and can be designed to inhibit damage due to static electricity. This inhibits damage to the device itself and also prevents deformation and breakage of its bonding wires. The reason for this improvement is their higher concentration of filler in that part of the coating remote from the element as compared to that part of the coating adjoining the element.

Figure 2:
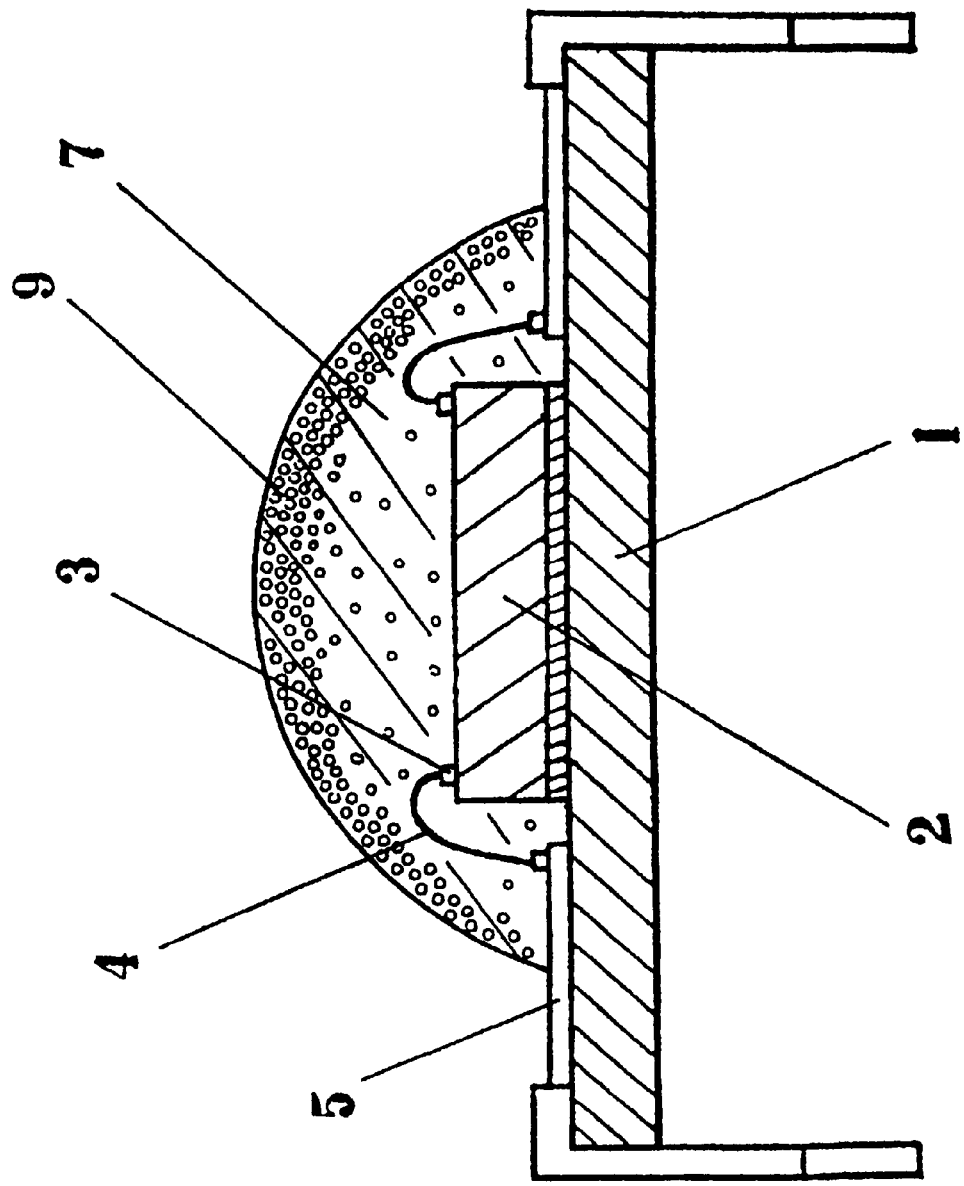
FIG. 2 shows the cross section of a semiconductor device according to the present invention as fabricated in Example 2 and 5.
Figure 3:
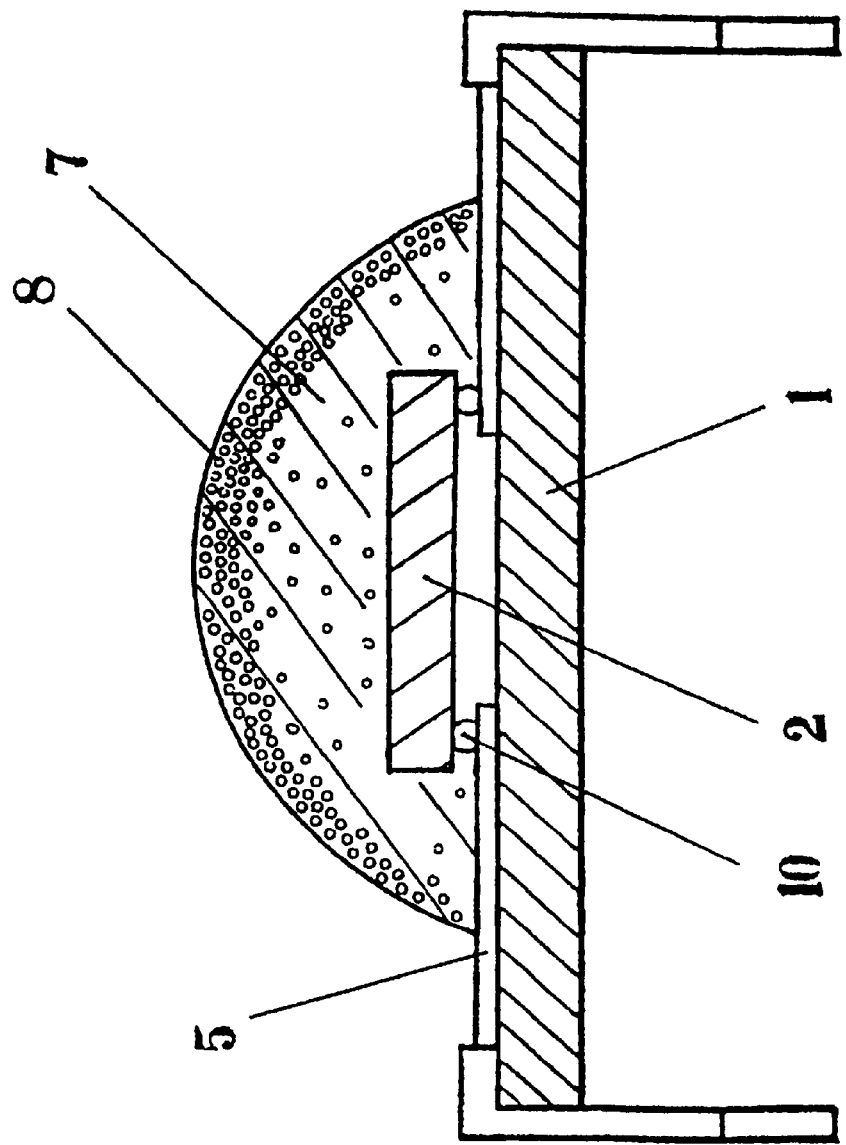
FIG. 3 shows the cross section of a face-down semiconductor device according to the present invention.

The structure of the semiconductor device of the present invention is not critical. Generally, however, the device contains a semiconductor element such as, for example, a transistor, IC, LSI, and so forth, mounted in the semiconductor device. These semiconductor devices are exemplified by face-up semiconductor devices such as those of FIGS. 1 and 2 and face-down semiconductor devices such as those of FIG. 3.

Figure 1:
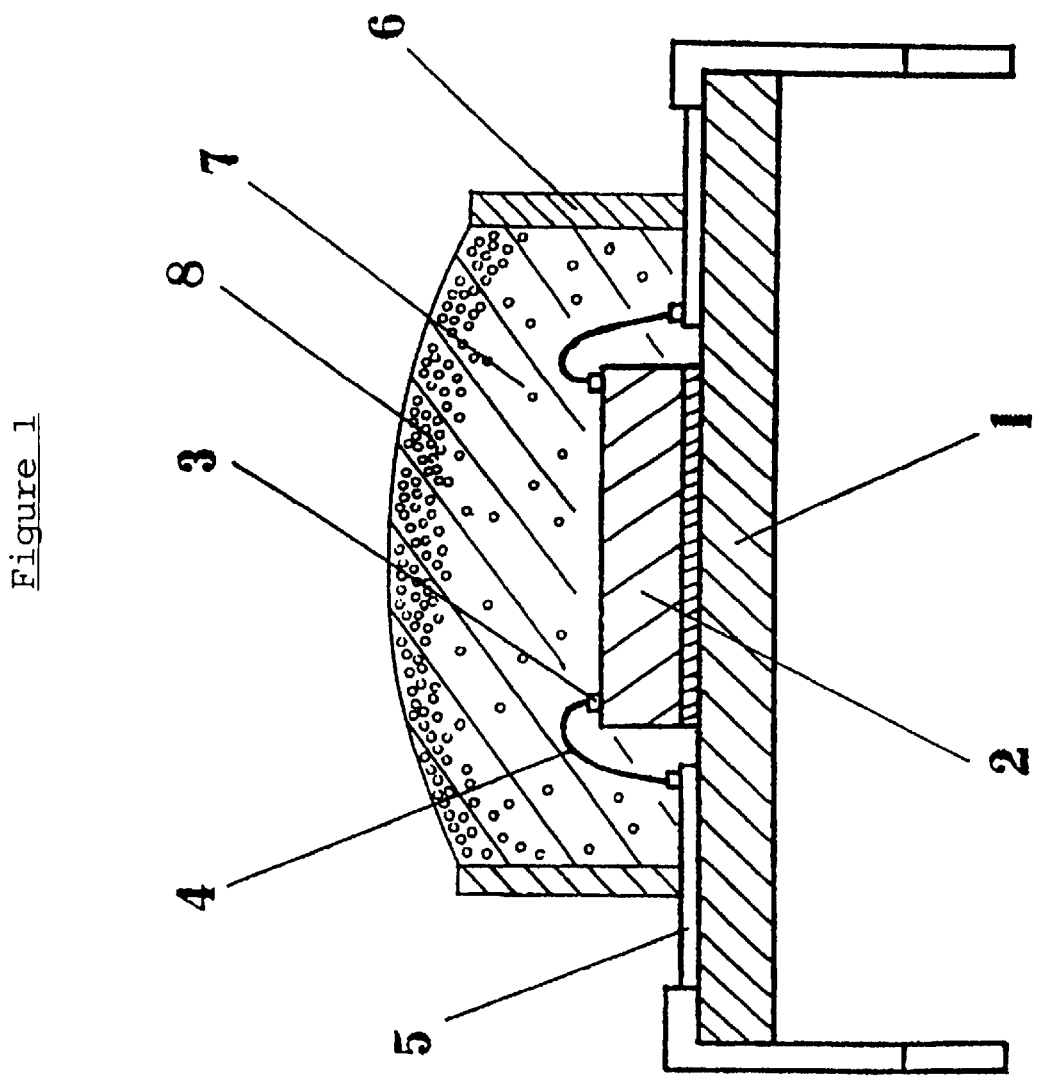
FIG. 1 shows the cross section of a semiconductor device according to the present invention as fabricated in Examples 1 and 3.

For simplicity, the present invention will be explained with reference to the semiconductor device in FIG. 1. This device has a structure in which a semiconductor element 2 mounted on substrate 1 is electrically connected to the lead frame 5 through bonding wires 4. The surface of said element 2 is coated with a cured silicone 7 in which filler 8 is dispersed.

The specific cured silicone 7 is not crucial, and it may be, for example, a gel or rubber. This cured silicone is formed by curing a curable silicone composition comprising a curable silicone polymer.

No specific limitations attach to the composition, curing mechanism, etc., of the curable silicone in the curable silicone composition. The curing mechanism of the curable silicone is exemplified by addition reaction-curing, condensation reaction-curing, radical reaction-curing, and ultraviolet-curing mechanisms. The addition reaction-curing mechanism is preferred.

The filler 8 is to have an average particle diameter of 0.01 to 500 micrometers and preferably 0.1 to 100 micrometers. The specific gravity of the filler should be 0.01 to 0.95. In particular, the filler's specific gravity is preferably 0.01 to 0.95-times and more preferably 0.1 to 0.9-times that of the non-filler components of the curable silicone composition that generates the cured silicone.

The characteristic feature of the semiconductor device according to the present invention is that the concentration of filler 8 present in the layer of cured silicone 7 remote from the semiconductor element 2 is higher than the concentration of said filler 8 present in the layer of cured material 7 adjoining the semiconductor element 2. No limitations otherwise apply to either the concentration of filler 8 in the layer of cured silicone 7 remote from the semiconductor element 2 or to the concentration of the filler 8 in the layer of cured material 7 adjoining the element 2.

The variation in filler concentration in the silicone may be continuous or discontinuous as one moves from the layer of cured material 7 adjoining the element 2 to the layer of cured material 7 remote from the element 2.

When the filler in the present invention is used to inhibit damage due to cleaning with solvents, the higher concentration of the filler 8 dispersed in the layer of cured silicone 7 remote from the semiconductor device 2 functions to inhibit swelling of the cured silicone 7 when the semiconductor device is subjected to solvent cleaning after mounting on a circuit substrate. Moreover, the lower concentration of the filler 8 dispersed in the layer of cured material 7 adjoining the element 2 inhibits damage to the surface of the element 2 by the filler 8 dispersed in this layer of the cured material 7 when the device is thermally cycled. Further, the lower concentration inhibits deformation or destruction of the element 2 and deformation or snapping of the bonding wires 5.

When the filler in the present invention is used to inhibit damage due to static electricity, the higher concentration of the filler 8 dispersed in the layer of cured silicone 7 remote from the semiconductor device 2 functions to prevent the generation of static charge and to dissipate static charge after the semiconductor device has been mounted on a circuit substrate. Moreover, the lower concentration of the filler 8 dispersed in the layer of cured material 7 adjoining the element 2 prevents electrical short circuiting of the element and inhibits damage to the surface of the element 2 by the filler 8 dispersed in this layer of the cured material 7 when the device is thermally cycled. Further, the lower concentration inhibits deformation or destruction of the element 2 and deformation or snapping of the bonding wires 5.

In particularly preferred embodiments of the semiconductor device according to the present invention, there is a high concentration of filler 8 in the layer of cured silicone 7 remote from the semiconductor element 2 and the filler 8 is almost completely absent from the layer of the cured material 7 adjoining the element 2.

In the case of fillers used to inhibit damage due to cleaning with solvents, the material constituting the filler 8 is not critical and is exemplified by the powders of organic resins such as nylon resins, polyethylene resins, polypropylene resins, polystyrene resins, acrylic resins, fluororesins, epoxy resins, phenolic resins, polyethylene terephthalate resins, and so forth; by the hollow forms of these organic resin powders; and by hollow inorganic powders such as hollow glass powders, hollow silica powders, hollow alumina powders, hollow ceramic powders, and the like. This filler 8 is preferably a heat-distortable or thermally deformable organic resin powder. The use of a heat-distortable organic resin powder is preferably accompanied by the use of an addition reaction-curing curable silicone composition as the curable silicone composition. In this embodiment, curing of the composition at temperatures at or above the heat-distortion temperature of the organic resin powder will cause heat distortion and melt-adhesion of at least a portion of the organic resin powder 8 in the layer of the cured silicone 7 remote from the semiconductor element 2. This will make this layer relatively harder as a result.

In the case of fillers used to inhibit damage due to static electricity, the material constituting the filler is not crucial as long as the filler is either intrinsically electrically conductive or has a surface that is electrically conductive. The electrically conductive filler is exemplified by powders coated with an electrically conductive material and hollow powders of copper, aluminum, silver, zinc, carbon, and so forth. Examples of coated powders include organic resin powders, hollow organic resin powders, and hollow inorganic powders, in each case having a surface coating of an electrically conductive material such as copper, aluminum, silver, zinc, carbon, etc. The organic resins constituting said organic resin powders and hollow organic resin powders are exemplified by nylon, polyethylene, polypropylene, polystyrene, acrylic resins, fluororesins, epoxy resins, phenolic resins, polyethylene terephthalate, and so forth. The inorganic hollow powders are exemplified by hollow glass powders, hollow silica powders, hollow alumina powders, hollow ceramic powders, and so forth. The electrically conductive filler is also exemplified by the hollow powders of copper, aluminum, silver, zinc, carbon, and so forth.

When the coating is used to inhibit damage due to static electricity, the surface of the cured silicone is preferably grounded in the case of relatively large semiconductor devices. Methods for this are exemplified by grounding the surface of the cured silicone using a conductive trace or lead and by the formation of a dam with a volume resistivity from $1 \times 10^6$ to $1 \times 10^{11}$ ohm-cm around the circumference of the substrate-mounted semiconductor element. The latter method is preferred. This grounding inhibits the accumulation of static electricity on the cured silicone 7 that coats the surface of the semiconductor element 2 and also serves to rapidly dissipate any charge that may accumulate.

The quantity of filler addition is not crucial, and the appropriate addition should be selected, for example, based on the average particle diameter and specific gravity of the filler, the application of the obtained semiconductor device, and so forth. The range of 0.1 to 80 wt % in the composition is generally preferred.

In one embodiment of the invention, the cured silicone coating the surface of the semiconductor element resists swelling when the device is cleaned with solvent. This avoids deformation or destruction of the element and deformation or breakage of the bonding wires. As a result, the element need not be sealed in a ceramic or plastic package as with prior-art semiconductor devices. This permits a substantial simplification in the structure of subject semiconductor device.

In a second embodiment of the invention, semiconductor devices used in static-prone locations such as image sensors, thermal print heads, etc., resist failure and faulty operation that can be induced by static electricity. This is due to the fact that the cured silicone that coats the surface of the semiconductor element is resistant to the accumulation of static electricity. Moreover, because the semiconductor devices according to the present invention do not require coating with metal or plastic as is practiced with prior-art semiconductor devices, the structure of the instant device can be substantially simplified and its cost can be reduced.

The fabrication method according to the present invention commences with coating the above-described curable silicone composition on the surface of a semiconductor element. This is typically done using a dispenser.

The composition is then allowed to stand for a period of time long enough for the filler in the layer of the curable silicone composition adjoining the semiconductor element to migrate into the layer of the composition that is remote from the element. This holding period is followed by curing. The length of this holding period cannot be rigorously specified because it will vary as a function of the difference in specific gravities between the filler and non-filler fraction of the curable silicone composition, the viscosity of the curable silicone composition, the average particle diameter of the filler, the quantity of filler addition, and so forth. However, when the curable silicone composition has a low viscosity and there is a large difference in specific gravities between the filler and non-filler fraction of the curable silicone composition, the holding period requirement will be satisfied even immediately after the composition has been coated on the surface of the semiconductor element. The use of very long holding times will permit the formation of a discontinuous dispersion of the filler in the cured silicone layers, in which there will be almost no filler dispersed in the cured silicone layer adjoining the semiconductor element and the filler will be dispersed only in the cured material remote from the element. The use of brief but still adequate holding times permits the formation of silicone layers in which the concentration of the filler continuously increases moving from the layer of cured material adjoining the element to the layer of cured material remote from the element.

When the cured silicone coating the surface of the semiconductor element is used to resist swelling when the device is cleaned with solvent, it is also preferred that the filler be a heat-distortable or -deformable organic resin powder, and the use of such a filler is preferably accompanied by the use of an addition reaction-curing curable silicone composition as the curable silicone composition. When an addition reaction-curing curable silicone composition filled with a heat-distortable organic resin powder is coated on the surface of the semiconductor element and then heated to at least the heat-distortion temperature of the powder, at least a portion of the powder in the cured silicone layer remote from the semiconductor element will be thermally distorted and melt-adhered. This results in a relatively hard layer.

When the cured silicone coating the surface of the semiconductor element is used to inhibit damage due to static electricity, the surface of the cured silicone is preferably grounded in the case of relatively large semiconductor devices. Methods for this are exemplified by grounding the surface of the cured silicone using a conductive trace or lead and by the preliminary formation of a dam with a volume resistivity from $1\times10^6$ to $1\times10^{11}$ ohm-cm at the circumference of the substrate-mounted semiconductor element. The latter method is preferred. After this dam has been formed around the circumference of the semiconductor element, the surface of the semiconductor element mounted within the dam is preferably coated with the curable silicone composition containing the electrically conductive filler. This grounding inhibits the accumulation of static electricity on the cured silicone that coats the surface of the semiconductor element and also serves to rapidly dissipate any charge that may accumulate.

The method according to the present invention makes it unnecessary to additionally seal the semiconductor element with a metal, ceramic or plastic package or coating. This provides for a substantial abbreviation of the process for manufacturing highly reliable semiconductor devices.

EXAMPLES

Semiconductor devices according to the present invention and their method of fabrication will be explained in greater detail through working examples. FIG. 1 contains the cross section of a semiconductor device according to the present invention as fabricated in Examples 1 and 3, and FIG. 2 contains the cross section of a semiconductor device according to the present invention as fabricated in Example 2 and 5. The reported viscosity values were measured at 25° C.

Example 1

An opaque white curable silicone composition was prepared by homogeneously mixing 100 weight parts of a curable organopolysiloxane comprising a mixture of an organopolysiloxane polymer having alkenyl groups, an organopolysiloxane polymer having silicon bonded hydrogens and a platinum catalyst for hydrosilylation curing (viscosity=400 centipoise, specific gravity=1.0) and 20 weight parts polypropylene resin powder (average particle diameter =50 micrometers, specific gravity=0.9, heat-distortion temperature=100° C.). The organopolysiloxane cures through an addition reaction to give a transparent silicone rubber with a durometer (JIS A) of 32.

A semiconductor element 2 carrying an aluminum circuit pattern was mounted on the surface of a glass substrate 1, and the bonding pads 3 on the top edges of the element 2 were then electrically connected to the lead fiame 5 through gold bonding wires 4. The aforementioned curable silicone composition was thereafter carefully coated on the surface of the semiconductor element 2 without overflowing the metal frame 6 (height=2 mm). This was followed by holding at room temperature for 30 minutes and then heating in a forced circulation oven at 150° C. for 30 minutes to yield the completed semiconductor device.

Inspection of this semiconductor device with a stereoscopic microscope showed that the polypropylene resin powder 8 in the cured silicone 7 coated on the surface of semiconductor element 2 was present dispersed only in the layer of the cured material 7 remote from the element 2. It was also observed that a portion of the powder 8 had undergone heat distortion and melt-adhesion. Finally, almost no polypropylene resin powder 8 was observed in the layer of cured silicone 7 adjoining the semiconductor element 2 which as a result was transparent.

The fabricated semiconductor device was subsequently immersed in 1,1,1-trichloroethane at 25° C. for 30 minutes and then removed and again inspected with the stereoscopic microscope. Almost no swelling of the cured silicone 7 was observed. In addition, neither destruction or deformation of the semiconductor element 2 in the semiconductor device nor deformation or rupture of the bonding wires 4 were observed.

Comparative Example 1

A semiconductor device was fabricated as in Example 1, with the exception that in this case the curable organopolysiloxane described in Example 1 was used by itself as the curable silicone composition. Substantial swelling of the cured silicone 7 was observed when this semiconductor device was immersed in 1,1,1-trichloroethane as in Example 1. While the semiconductor element 2 in the semiconductor device was not destroyed or deformed, deformation of some of the bonding wires 4 was observed.

Example 2

An opaque white curable silicone composition was prepared by homogeneously mixing 100 weight parts of the curable organopolysiloxane of Example 1 with 60 weight parts hollow ceramic powder (average particle diameter=40 micrometers, specific gravity=0.70).

A semiconductor element 2 carrying an aluminum circuit pattern was mounted on the surface of a glass circuit substrate 1, and the bonding pads 3 on the top edges of the element 2 were then electrically connected to the lead frame 5 through gold bonding wires 4. The aforementioned curable silicone composition was thereafter coated on the surface of the semiconductor element 2. This was followed by holding at room temperature for 1 hour and then heating in a forced circulation oven at 150° C. for 30 minutes to yield the completed semiconductor device.

Inspection of this semiconductor device with a stereoscopic microscope showed that the hollow ceramic powder 9 in the cured silicone 7 was present dispersed only in the layer of the cured silicone 7 remote from the element 2. Almost no powder 9 was observed in the layer of cured silicone 7 adjoining the semiconductor element 2, which as a result was transparent.

The fabricated semiconductor device was subsequently immersed in 1,1,1-trichloroethane at 25° C. for 30 minutes and then removed and again inspected with the stereoscopic microscope: almost no swelling of the cured silicone 7 was observed. In addition, neither destruction or deformation of the semiconductor element 2 in the semiconductor device nor deformation or rupture of the bonding wires 4 were observed.

Example 3

An opaque white curable silicone composition was prepared by homogeneously mixing 100 weight parts of the curable organopolysiloxane of Example 1 and 10 weight parts of a hollow ceramic powder having an aluminum-coated surface (average particle diameter=40 micrometers, specific gravity=0.80).

A semiconductor element 2 carrying an aluminum circuit pattern was mounted on the surface of a glass substrate 1, and the bonding pads 3 on the top edges of the element 2 were then electrically connected to the lead frame 5 through gold bonding wires 4. A dam 6 (height=2 mm) of glass-reinforced epoxy resin was then formed around the circumference of the semiconductor element 2, and the aforementioned curable silicone composition was thereafter carefully coated on the surface of the semiconductor element 2. This was followed by holding at room temperature for 5 minutes and then heating in a forced circulation oven at 150° C. for 30 minutes to yield the completed semiconductor device. Twenty of these semiconductor devices were fabricated by this procedure. Inspection of these semiconductor devices with a stereoscopic microscope showed that the hollow ceramic powder 8 present in the cured silicone 7 coating the surface of the semiconductor element 2 was dispersed only in the layer of cured material 7 remote from the element 2. Almost no hollow ceramic powder 8 was observed in the layer of cured silicone 7 adjoining the semiconductor element 2, which as a result was transparent.

These semiconductor devices were tested as follows: the surface of each semiconductor device was subjected to 500 back-and-forth excursions while contacting ordinary A4 copy paper at a contact pressure of 10 g/cm$^2$ (lengthwise excursion, velocity=5 cm/second). Operating tests were then carried out on each semiconductor device, and no failure or erratic operation was observed for any of the semiconductor elements.

Comparative Example 2

Twenty semiconductor devices were fabricated as in Example 3, but in this case without using the hollow ceramic powder. These semiconductor devices were subjected to performance testing as in Example 3. Erratic operation was observed in 2 of the semiconductor elements.

Example 4

Twenty semiconductor devices were fabricated as in Example 3, but in this case using a silicone rubber dam 6 with a volume resistivity of $1\times10^8$ ohm-cm. These semiconductor devices were subjected to performance testing as in Example 3. No failure or erratic operation was observed for any of the semiconductor elements.

Example 5

An opaque white curable silicone composition was prepared by homogeneously mixing 100 weight parts of the curable silicone of Example 1 and 10 weight parts of a hollow ceramic powder having a silver-coated surface (average particle diameter=20 micrometers, specific gravity=0.70).

A semiconductor element 2 carrying an aluminum circuit pattern was mounted on the surface of a glass substrate 1, and the bonding pads 3 on the top edges of the element 2 were then electrically connected to the lead frame 5 through gold bonding wires 4. The aforementioned curable silicone composition was thereafter coated on the surface of the semiconductor element 2. This was followed by holding at room temperature for 5 minutes and then heating in a forced circulation oven at 150° C. for 30 minutes to yield the completed semiconductor device. Twenty semiconductor devices were fabricated in this manner. Inspection of these semiconductor devices with a stereoscopic microscope showed that the hollow ceramic powder 9 present in the cured silicone 7 was dispersed only in the layer of cured material 7 remote from the element 2. Almost no powder 9 was observed in the layer of cured silicone 7 adjoining the semiconductor element 2, which as a result was transparent.

These semiconductor devices were tested as follows: the surface of each semiconductor device was subjected to 500 back-and-forth excursions while contacting ordinary A4 copy paper at a contact pressure of 10 g/cm$^2$ (lengthwise excursion, velocity=5 cm/second). Operating tests were then carried out on each semiconductor device, and no failure or erratic operation was observed for any of the semiconductor elements.

Example 6

Twenty semiconductor devices were fabricated as in Example 5, but in this case forming a ground by using an electrically conductive adhesive to fix a copper lead wire to the edge of the cured silicone 7 used in Example 5. These semiconductor devices were subjected to performance testing as in Example 5. No failure or erratic operation was observed for any of the semiconductor elements.

That which is claimed is:

1. A method for fabricating a semiconductor device, comprising the steps of:

coating the surface of a semiconductor element with a curable silicone composition comprising a curable silicone polymer and a filler having an average particle diameter of 0.01 to 500 micrometers and a specific gravity of 0.01 to 0.95, wherein the filler is selected from the group consisting of powders of organic resins, hollow forms of organic resin powders, hollow inorganic powders, intrinsically electrically conductive fillers, and fillers having a surface that is electrically conductive;

allowing sufficient time to elapse for the filler in the part of the curable silicone composition adjoining the element to migrate into the part of the curable silicone composition remote from the element; and curing the curable silicone composition.

2. The method according to claim 1, wherein the average particle diameter of the filler is from 0.1 to 100 micrometers.

3. The method according to claim 1, wherein the specific gravity of the filler is from 0.01 to 0.95 times the specific gravity of the non-filler components of the curable silicone composition.

4. The method according to claim 3, wherein the specific gravity of the filler is from 0.1 to 0.9 times the specific gravity of the non-filler components of the curable silicone composition.

5. The method according to claim 1, wherein the curable silicone composition is selected from the group consisting of addition reaction-curable, condensation reaction-curable, radical reaction-curable, and ultraviolet-curable silicone compositions.

6. The method according to claim 5, wherein the curable silicone composition is an addition reaction-curable composition, the filler is a heat-distortable organic resin powder, and the step of curing is performed by heating the curable silicone composition to at least the heat-distortion temperature of the organic resin powder.

* * * * *